United States Patent [19]

Webster

[11] 4,287,572

[45] Sep. 1, 1981

[54] METHOD FOR WRITING ON ARCHIVAL TARGET AND TARGET PRODUCED THEREBY

[75] Inventor: Harold F. Webster, Scotia, N.Y.

[73] Assignee: General Electric Company, Schenectady, N.Y.

[21] Appl. No.: 68,680

[22] Filed: Aug. 22, 1979

[51] Int. Cl.³ .............................................. G11C 11/26
[52] U.S. Cl. ....................................... 365/128; 315/1; 365/105; 365/120
[58] Field of Search ............... 365/105, 118, 120, 128, 365/165; 315/1, 84.5

[56] References Cited

U.S. PATENT DOCUMENTS 3,412,220  11/1968  Puppoco ............................ 365/165

Primary Examiner—Terrell W. Fears
Attorney, Agent, or Firm—Geoffrey H. Krauss; James C. Davis; Marvin Snyder

[57] ABSTRACT

A method for storing data in an archival memory semiconductor target by providing a masking layer of a conductive material on the surface of an insulative layer upon the top surface of a semiconductor substrate; the material layer is assigned a two-dimensional array of possible data storage sites. The masking layer at those storage sites at which a first binary value is to be stored, is melted; the selected material is one which, at the melting temperature thereof, does not wet the surface of the chosen insulator whereby apertures are formed by the writing electron beam in the masking layer, at energy levels insufficient to evaporate the masking material. The writing beam energy is reduced at the data sites at which data bits of the remaining binary value are to be stored, and does not melt the masking material thereat. The data stored in the target is read by sweeping an electron beam of relatively low energy across the array to induce a flow of current from the semiconductor substrate and of magnitude dependent upon the presence or absence of an aperture in the masking layer at the data site interrogated.

17 Claims, 1 Drawing Figure

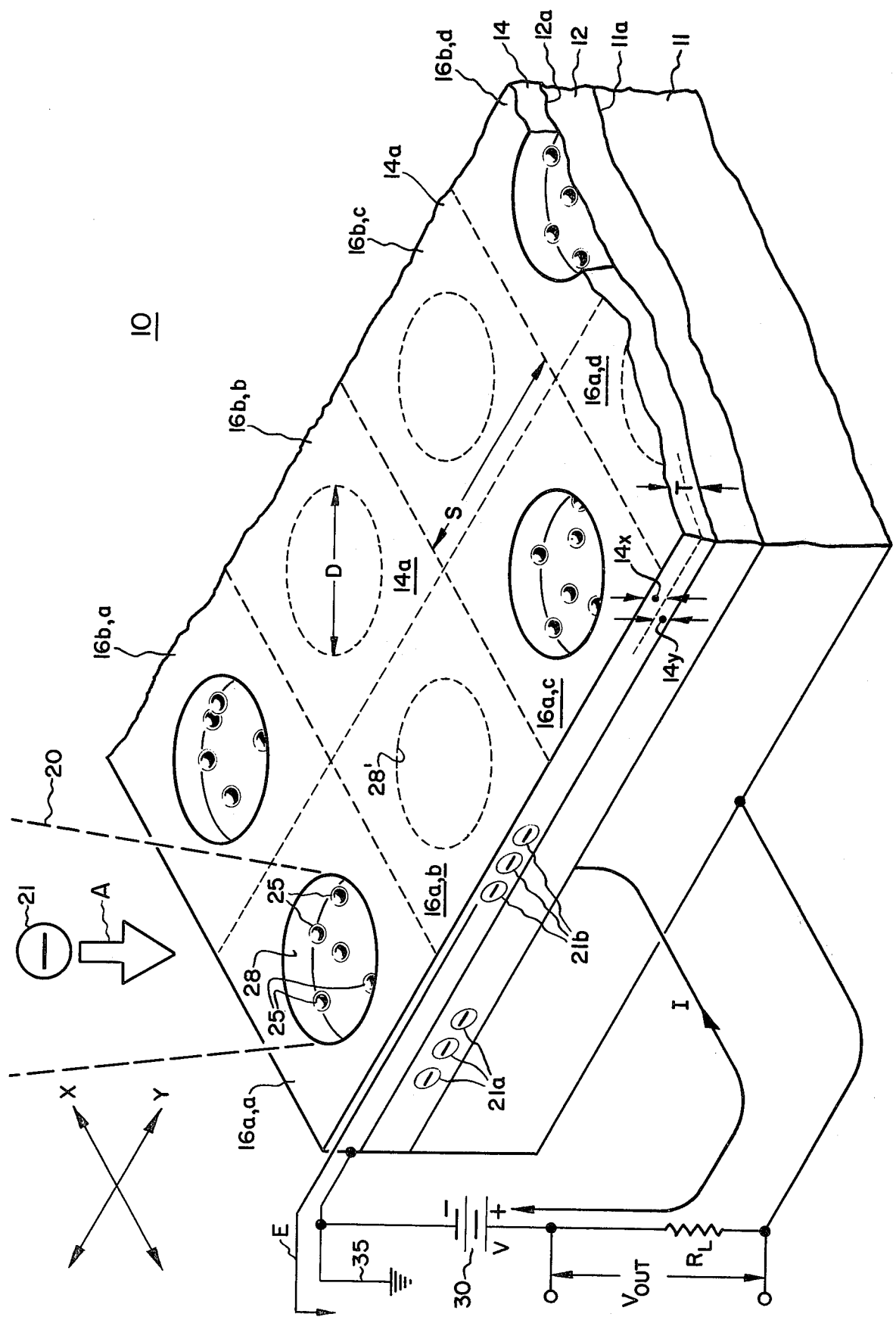

METHOD FOR WRITING ON ARCHIVAL TARGET AND TARGET PRODUCED THEREBY

BACKGROUND OF THE INVENTION

The present invention relates to methods of storing information and, more particularly, to a novel method for storing data in an archival memory semiconductor target by means of melting apertures in a non-wetting material layer upon a surface of the target, and the target produced thereby.

Archival memory media, exhibiting a read-only structure, is often required for storing large quantities of data, usually in a digital binary format. The storage media must be non-volatile, whereby data is stored without changing content over long periods of time. Several methods have been proposed for writing binary data into small storage sites, typically having center-to-center spacings on the order of microns, to facilitate the necessary packing densities. Typically, digital information is initially entered into memory and maintained essentially in an unchanged state for the entire storage interval, once the authenticity and parity of the data written into the memory is confirmed. The data may be frequently accessed and read, whereby the same stored information is repeatedly retrieved.

It is known to fabricate archival memory media of a semiconductor target type, by the methods and as the structures disclosed and claimed in U.S. Pat. No. 4,064,495, issued Dec. 20, 1977; U.S. Pat. No. 4,081,794, issued Mar. 28, 1978; and U.S. Pat. No. 4,099,261, issued July 4, 1978, all assigned to the assignee of the present invention and all incorporated in their entirety herein by reference. Each of the aforementioned references utilizes a planar junction diode structure upon which binary-valued data is stored by modification of the semiconductor properties of at least one of a pair of semiconductor layers in a diode structure. Such modification of a semiconductor layer structure may be by means of ion-implanted diodes as disclosed and claimed in U.S. Pat. No. 4,064,495; by formation of P-N junction diodes alloyed into the surface of the chosen semiconductor layer, as disclosed and claimed in U.S. Pat. No. 4,081,794; or by damaging the semiconductor lattice of the chosen layer by accelerating ions for impingement upon the layer surface to induce damage therein to a controlled depth, as disclosed and claimed in U.S. Pat. No. 4,099,251. It is desirable to provide a semiconductor archival memory target in which a planar diode structure is unnecessary and which requires a minimal amount of energy to impinge thereon for writing an individual data bit into the target, whereby the impinging beam, typically being a beam of electrons, may write data into the target at an accelerated rate due to the reduced requirements for switching a high-energy beam between two energy values, each corresponding to either a first binary value or a second binary value.

It has been proposed that binary data be recorded on a target by evaporating off a thin layer of selenium, or tellerium, from the surface of an insulative layer supported by a semiconductor substrate, in selected areas where a data bit of a first binary value is to be recorded. A writing electron beam impinges upon the desired area for evaporation of the selenium; subsequently, a reading electron beam (of energy insufficient to evaporate the selenium) is directed through the hole evaporated in the selenium and enters the silicon-insulator sandwich with subsequent recovery of a first output level. Impingement of the reading electron beam upon an area in which a hole has not been evaporated, prevents electrons of the beam from entering the insulator-semiconductor sandwich and a provides a different value of target output current, to read the remaining binary data bit value. To achieve a difference in target output signals, between the pair of binary data values, the insulator layer is required to be sufficiently thin whereby spot heating of the selenium layer, for evaporation of apertures therein, induces heat energy sufficient to disrupt the integrity of at least the underlying insulative layer. The resulting target has reduced difference in signal output levels for the binary data values and may, in fact, be rendered unusable if sufficient heat energy is utilized during the data-writing evaporation step. It is therefore desirable to provide a method for recording binary data in an archival memory semiconductor target, in which reduced heating of the target occurs during the data writing step.

BRIEF SUMMARY OF THE INVENTION

In accordance with the invention, binary data is written into an archival memory target, having a semiconductor substrate upon which an insulative layer is fabricated prior to the fabrication of a thin layer upon the surface of the insulative layer, furthest from the substrate, of a layer of masking material selected to not significantly wet the surface of the insulative layer when an area of the masking material layer is melted by impinging of an electron beam thereon of energy sufficient to melt the masking material only at sites at which a first value of binary data is to be stored. The melted material of the masking layer, when cooled, tends to ball up into a few high-contact-angle droplets, leaving most of the insulator layer surface within the melted aperture completely bare and presenting substantially no interference to the passage of a reading electron beam, of energy insufficient to melt the masking layer material, when the data site is subsequently read. The melting of a non-wetting material layer requires less energy than the energy required to evaporate the same material from the surface of the insulative layer, thereby reducing the amount of heat energy to which the insulative layer is subject.

In a preferred embodiment, the masking materials are selected from the elements including indium, lead, bismuth, cadmium, zinc, antimony, aluminum, gallium, and silver, or alloys of indium and either gallium or lead. The indium-gallium or indium-lead alloys have lower thermal conductivity than a pure metallic material. A pair of layers, of cadmium on top of zinc, forming a eutectic mixture when molten, may also be used.

In one presently preferred embodiment, a layer of indium metal of thickness between about 100 angstroms and about 1,000 angstroms is used, with apertures being melted through the indium layer at data sites, in a two-dimensional array upon the masking layer surface, at which a first binary data value is to be stored, and with the energy of the writing electron beam being reduced to impart temperature less than the melting temperature of the indium masking layer, and thus prevent formation of an aperture through the masking layer, at other data sites at which a remaining binary data value is to be stored.

Accordingly, it is an object of the present invention to provide a method for recording binary data in an archival memory semiconductor target by selective melting of a material which does not wet the surface of an insulative layer of a target.

It is another object of the present invention to provide archival memory targets having non-wetting masking layers in which information is stored by selective melting of the masking layer of material.

These and other objects of the present invention will become apparent upon consideration of the following detailed description, taken in conjunction with the drawings.

BRIEF DESCRIPTION OF THE DRAWINGS

The sole FIGURE is a perspective view, not to scale, of a portion of a semiconductor archival memory target and illustrates the method of writing data into, and reading data from, the target in accordance with the principles of the present invention.

DETAILED DESCRIPTION OF THE INVENTION

Referring to the sole FIGURE, an archival memory target 10 has a substrate 11 of a semiconductor material, such as silicon and the like. A layer 12 of an insulative material is fabricated upon a surface 11a of the semiconductor substrate. In the presently preferred embodiment, in which the semiconductor is silicon, insulative layer 12 is fabricated of silicon dioxide, in manner well known to the art. A masking layer 14 is fabricated upon the surface 12a of insulative layer 12 furthest from substrate 11. The material of masking layer 14 is selected to be a material which does not wet the surface 12a of the underlying layer of insulation or the semiconductor substrate. The surface 14a of the masking material layer, furthest from insulative layer 12, has a two-dimensional array of possible data sites 16a, a. . .16z,z assigned thereto. For purposes of simplicity, a portion of the storage site array is illustrated. In a first column (or row), of the storage site array, possible data sites 16a,a; 16a,b; 16a,c and 16a,d are illustrated. In the next adjacent row (or column) of the storage sites array, possible data site 16b,a; 16b,b; 16b,c and 16b,d are illustrated. It should be understood that the planar array may extend in both directions of arrows X and Y, defining the plane of masking layer surface 14a. Resolution between adjacent data sites, and hence, data density, is dependent upon the dimensions of each side S of the preferably square data site 16. The data site side dimension S is typically on the order of several microns and is generally much greater than the thickness T of the masking material layer, which thickness may be from about 100 angstroms to about 1,000 angstroms thin.

The material of masking layer 14 is melted by an impinging beam 20 of electrons 21, which beam is collimated or focused to have a diameter D less than the side dimension S of the data site, when impinging, in the direction of arrow A, upon masking layer surface 14a. Impinging electrons 21 heat the material of masking layer 14 sufficiently for the material to enter the molten liquid state, but insufficiently for the material to evaporate. As layer 14 is fabricated of a material which does not wet the surface 12a of the underlying insulative layer, the molten masking layer material, when cooling after removal of electron beam 20, forms mask material droplets 25 which have a high contact-angle with the insulative material surface 12a. The relatively few high-contact-angle droplets thus leaves the insulative layer surface substantially bare and does not block subsequent impingements of a beam 20, of reduced amplitude, utilized for reading operations, as hereinbelow explained.

The material of masking layer 14 is initially selected for the absence of the ability to wet the surface of the underlying insulative layer, and then for the minimum amount of energy necessary to warm a unit volume of the candidate masking layer material to the molten liquid state. Useful non-wetting materials (and the amount of energy, in calories per cubic centimeter, necessary to warm the material from a selected initial temperature to the melting point, plus the heat diffusion to melt that material) include: indium (108 calories/cm$^3$); lead (178 calories/cm$^3$); bismuth (195 calories/cm$^3$); cadmium (257 calories/cm$^3$); zinc (438 calories/cm$^3$); antimony (459 calories/cm$^3$); and aluminum (577 calories/cm$^3$). Thus, a masking layer 14 of indium requires the least amount of heat energy, induced by electron beam 20, for melting. In one of my preferred embodiments, a layer of indium is utilized with the aforementioned silicon dioxide insulative layer atop a silicon substrate. It should be understood that other materials, such as gallium and silver, may be equally as well utilized. All of the foregoing materials are metals, as masking layer 14 must be electrically conductive. Further, it is often desirable to utilize a masking material which has a low thermal conductivity, to reduce the amount of heat energy spreading laterally from the site of electron beam impingement, thereby reducing the heating effects upon the insulative layer. Low thermal conductivity masking material include alloys of indium and either gallium or lead; both of these alloy systems have solid solubility and thus have lower thermal conductivity than either metal, of the alloy, when pure. Also advantageous is a masking layer comprised of a pair of successive sublayers 14x and 14y, such as a thin cadmium layer 14x, between about 200 Angstroms and about 800 Angstroms, on top of a film 14y, between about 100 Angstroms and about 600 Angstroms thick, of zinc. The dual-sublayer mask materials form a eutectic mixture when heated and assure, especially when the lower melting temperature material is fabricated in the top sublayer 14x, that a non-wetting material is formed with relatively low writing energy.

Data is stored in archival memory target 10 by modulating the energy of electron beam 20 to a value sufficient to melt the masking material in a spot 28 approximately of diameter D, at those ones of possible data sites 16 (e.g. data site 16a,a) at which a bit of data having a first binary value is to be stored. The molten masking material is allowed to cool, as by reducing the energy of beam 20 or by moving the beam to another location. Upon cooling, the molten material cools into the few high contact-angle droplets 25, providing the aperture, at spot 28, through masking layer 14 to the surface of the underlying insulative layer. If a data bit of the remaining binary value is to be stored, as at subsequent data site 16a,b (if beam 20 is moved rightwardly in the Y direction), the energy of the beam is modulated to a lower value, whereby the beam energy impinging upon spot 28' is insufficient to melt the masking layer material thereof. The writing process continues with beam 20 being moved to each possible data site 16 in the portion of the two-dimensional data site array to be written and with the beam energy being modulated between energy levels sufficient and insufficient, respectively, to melt and not melt, respectively, the data sites spots to respectively store first binary values and second binary values, respectively, of data bits.

The stored information is read by reducing the energy of electron beam 20 to a level insufficient to melt material of masking layer 14 and then scanning the reduced-energy electron beam across the portion of the data site array to be read. When the reduced-energy reading electron beam impinges upon a data site at which an aperture 28 is present (e.g. data site 16a,a) the electrons of the beam pass through the aperture 28 and into insulative layer 12. A source 30 of potential V is connected in series with a load resistance $R_L$ between the masking layer 14 and semiconductor substrate 11. The polarity of potential source 30 is such as to reverse-bias semiconductor layer 11 with respect to masking layer 14. The electrons 21a introduced into insulative layer 12, at storage sites having one of apertures 28 previously formed therein, thus flow from the insulative layer, through the semiconductor substrate, to the positive terminal of potential source 30, whereby a flow of current I occurs through the load resistance $R_L$ and provides a relatively large magnitude of output signal $V_{OUT}$ thereacross. When the decreased-energy reading beam impinges upon a storage site (e.g. storage site 16a,b) at which an aperture 28 has not been previously formed through the masking layer, the electrons 21b are conducted through masking layer 14, in the direction of arrow E, to an electrical ground potential connection 35; relatively little current, other than the leakage current flowing through the insulative layer, flows through the load resistance and a relatively small output signal $V_{OUT}$ is generated.

The present invention is described with respect to several preferred embodiments; many variations and modifications will now occur to those skilled in the art. In particular, the substitution of other semiconductor materials, for silicon as described in the present description. Similarly, other insulative materials may be utilized and other conductive masking materials may be selected which are non-wetting to the surface of the insulative material chosen. Thus, I do not intend to be limited by the present disclosure but only by the appending claims.

What is claimed is:

1. A method for archival memory recording of data, comprising the steps of:
   (a) providing a semiconductor substrate having a surface;
   (b) fabricating a layer of insulative material upon said semiconductor substrate surface;
   (c) selecting a conductive material which does not, when molten, wet the surface of the insulative layer;
   (d) fabricating a layer of the selected non-wetting material upon the insulative material layer surface furthest from the substrate;
   (e) assigning a two-dimentional array of potential data storage sites upon the surface of the masking layer furthest from said insulative layer;
   (f) directing a beam of electrons sequentially to each of at least a portion of the array of potential data storage sites;
   (g) imparting sufficient energy to the electrons of said beam to melt the material of said masking layer when said beam impinges at each data storage at which a first binary value of data is to be stored; and
   (h) imparting another value of energy to the electrons of said beam, insufficient to melt the material of said masking layer, when said beam impinges at others of the potential data storage sites of said array at which a remaining value of binary data is to be stored.

2. The method of claim 1, wherein said semiconductor substrate is fabricated of silicon.

3. The method of claim 2, wherein the insulative material is silicon dioxide.

4. The method of claim 3, wherein step (c) comprises the step of selecting said conductive material from the group consisting of: indium, lead, bismuth, cadmium, zinc, antimony, aluminum, gallium and silver.

5. The method as set forth in claim 3, wherein step (c) comprises the step of selecting the masking material to be an alloy of indium and one of gallium and lead.

6. The method as set forth in claim 3, wherein step (c) and (d) include the steps of selecting a pair of conductive materials forming a non-wetting eutectic mixture, when molten, and solidifying to form high-contact-angle droplets; and fabricating each of said pair of conductive materials as one of a pair of sequential sublayers of said masking layer.

7. The method of claim 6, wherein the material with the lower melting temperature is fabricated as the sublayer furthest from the insulative layer.

8. The method of claim 6, wherein the materials are cadmium and zinc.

9. The method of claim 8, wherein the zinc sublayer is nearest to said insulative layer and has a thickness between about 100 and about 600 Angstroms; and the cadimum sublayer has a thickness between about 200 and 800 Angstroms.

10. The method as set forth in claim 1, wherein step (c) comprises the step of selecting said conductive material from the group consisting of: indium, lead, bismuth, cadmium, zinc, antimony, aluminum, gallium and silver.

11. The method as set forth in claim 1, wherein step (c) comprises the step of selecting the masking material to be an alloy of indium and one of gallium and lead.

12. The method of claim 1, wherein stop (d) includes the step of fabricating the material layer to a thickness between about 100 angstroms and about 1,000 angstroms.

13. The method as set forth in claim 1, wherein step (c) and (d) include the steps of selecting a pair of conductive materials forming a non-wetting eucetectic mixture when molten and solidifying to form high-control-angle droplets; and fabricating each of said pair of conductive materials as one of a pair of sequential sublayers of said masking layer.

14. The method of claim 13, wherein the material with the lower melting temperature is fabricated as the sublayer furthest from the insulative layer.

15. The method of claim 13, wherein the materials are cadmium and zinc.

16. The method of claim 15, wherein the zinc sublayer is nearest to said insulative layer and has a thickness between about 100 and about 600 Angstroms; and the cadimum sublayer has a thickness between about 200 and 800 Angstroms.

17. The method as set forth in claim 1, further including the steps of:
   (i) coupling a source of biasing potential and a load resistance in electrical series connection between the substrate and the masking layer;
   (j) reducing the energy of the electrons of said beam to a value insufficient to melt the material of the masking layer; and (k) directing the beam of electrons sequentially to each of the data storage sites in a portion of the array thereof from which stored binary data is to be read; a voltage being generated across said load resistance having respective first and second values responsive to the reading electron beam impinging upon data sites at which the masking material has been respectively melted and unmelted.

* * * * *